United States Patent [19]
Patron et al.

[11] Patent Number: 5,113,157
[45] Date of Patent: May 12, 1992

[54] HIGH-FREQUENCY ELECTRON TUBE POWER OSCILLATOR

[75] Inventors: Christian S. A. E. Patron; Eugene J. Sowinski, both of Eindhoven, Netherlands

[73] Assignee: U.S. Philips Corporation, New York, N.Y.

[21] Appl. No.: 693,977

[22] Filed: Apr. 29, 1991

[30] Foreign Application Priority Data

May 3, 1990 [NL] Netherlands ............... 9001060

[51] Int. Cl.$^5$ ............................................. H03B 1/00
[52] U.S. Cl. ..................................... 331/167; 331/171
[58] Field of Search ............... 331/167, 168, 169, 170, 331/171; 328/209, 225, 226

[56] References Cited

U.S. PATENT DOCUMENTS

| | | |
|---|---|---|
| 4,761,618 | 8/1988 | Patron et al. ............ 331/167 |
| 4,761,619 | 8/1988 | Patron ...................... 331/167 |
| 4,954,792 | 9/1990 | Patron ...................... 331/169 |

*Primary Examiner*—Robert J. Pascal
*Attorney, Agent, or Firm*—Bernard Franzblau

[57] ABSTRACT

A high-frequency electron tube power oscillator includes a multi-grid electron tube (1) in which the output power is adjusted by means of an adjustable impedance element (5) connected in series with the cathode line of the tetrode (1). In order to reduce the dissipated power in the adjustable impedance element (5), the voltage across the impedance element is connected to the screen grid of the tetrode (1) through an amplifier (6) constituted by a triode (9) and a current source (10).

11 Claims, 1 Drawing Sheet

HIGH-FREQUENCY ELECTRON TUBE POWER OSCILLATOR

BACKGROUND OF THE INVENTION

This invention relates to high-frequency electron tube power oscillator comprising an adjustable impedance element connected in series with the cathode of the electron tube.

A high-frequency electron tube power oscillator of this type is known from Dutch Patent Specification 148202.

Generally, it is advantageous to be able to control the power supplied by such high-frequency electron tube oscillators.

A first method of realizing this control is to make the D.C. anode voltage of the electron tube variable. This can be achieved by control of the firing angle of the applied mains voltage by means of thyrisors, before transforming this voltage to the desired high voltage.

Power control by control of the firing angle causes rather substantial high-frequency noise-voltage on the mains. A second disadvantage of this type of power control is the fact that the high voltage is equal to zero for a part of the period of the mains voltage. Consequently, a large and costly high voltage smoothing filter will be necessary in many cases.

A second method of controlling the supplied power is described in the aforementioned Patent Specification. In that document the power supplied is controlled by means of an adjustable impedance element connected in series with the cathode of the electron tube.

By increasing the impedance value of the impedance element, the D.C. voltage across the impedance element increases. As a result of this increase the voltage difference between the cathode and control grid becomes more negative. Consequently, the D.C anode current of the electron tube and thus the supplied power decreases.

A disadvantage of this prior art high-frequency power oscillator is the large power dissipation occuring in the adjustable impedance element. This power may be about 10% of the power to be controlled. This is especially detrimental for large powers (for example, powers of several hundred kilowatts), more particularly if the impedance element is to be arranged in the form of an adjustable semiconductor element.

SUMMARY OF THE INVENTION

It is an object of the invention to provide a high-frequency electron tube power oscillator whose supplied power can be controlled by means of an impedance element connected in series with the cathode line, and which has a considerably lower power dissipation in the adjustable impedance element than the power dissipation in a prior art oscillator.

For this purpose, the invention is characterized in that the electron tube is arranged as a multigrid electron tube comprising at least one control grid and an additional grid, in that an inverting amplifier is included whose input is coupled to the cathode side of the impedance element and whose output is coupled to the additional grid of the electron tube.

An increase of the value of the impedance element will lead to an increase of the voltage across the impedance element. Consequently, the anode current will decrease. Since the voltage across the impedance element is supplied to the additional grid of the electron tube through the inverting amplifier, the voltage on the additional grid will drop to an even larger extent. This will result in an enhanced reduction of the anode current. Thus, the effect that a certain voltage change across the impedance element has on the anode current is enhanced.

For a given variation of the anode current it is now sufficient to realize a smaller voltage swing across the impedance element than is necessary in the prior art triode oscillator. As a result of this smaller voltage swing the quiescent voltage across the impedance element may now be adjusted to a lower value than was necessary in the prior art, so that the dissipation in this impedance element will be lower.

According to a preferred embodiment the high-frequency electron tube power oscillator is characterized in that the inverting amplifier comprises a current source and a triode whose anode forms the output of the amplifier, to which output the current source also is coupled, the control grid being coupled to the negative terminal of a variable voltage source and the input of the amplifier being formed by the positive terminal of the variable voltage source.

An advantage of this embodiment is that the current in the additional grid of the electron tube can never exceed the current supplied by the current source. Without this limitation and in the event that the anode voltage drops out, an excessively high current might flow into the additional grid due to which it could be damaged.

If the high-frequency electron tube power oscillator is operated with a pulsating voltage a problem may arise when a current source is connected to the additional grid of the electron tube. When the control grid of the electron tube is shut down a high voltage will occur on the additional grid because the load impedance of the current source will increase. This high voltage on the additional grid may impede the pulsating operation of the oscillator.

A known property of a triode is that the anode current will increase greatly when the anode voltage exceeds a specific value. Consequently, a triode has a voltage-constraining effect.

Since the additional grid of the electron tube in the high-frequency electron tube power oscillator is connected to the anode of the triode, the aforementioned voltage increase on the additional grid when the oscillator is operated in a pulsating manner will now remain restricted.

BRIEF DESCRIPTION OF THE DRAWING

The invention will be further explained with reference to the accompanying drawing in which like elements are denoted by like reference characters and in which.

DESCRIPTION OF THE PREFERRED EMBODIMENTS

Figure 1:
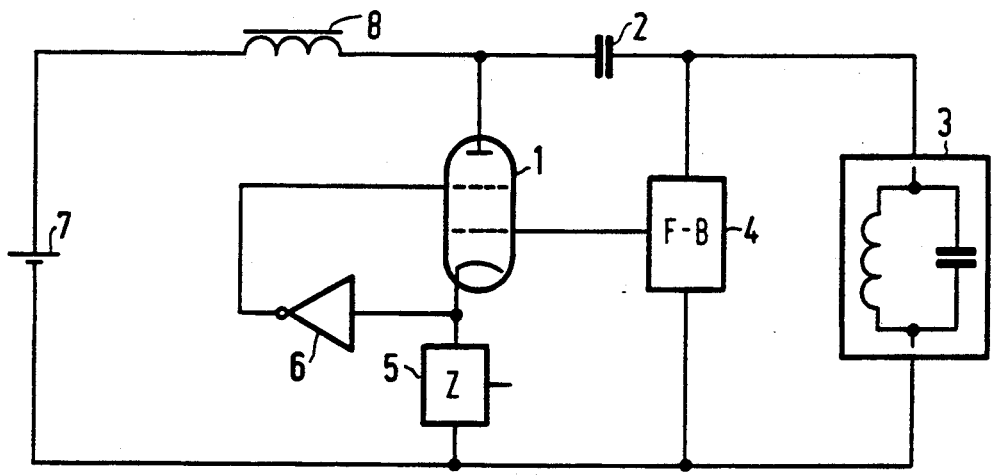
FIG. 1 shows a diagrammatic representation of the oscillator according to the invention.

In FIG. 1 the multi-grid electron tube of the high-frequency electron tube power oscillator is formed by the tetrode 1 whose anode, through the coupling capacitor 2, is connected to the frequency-determining element 3 and the input of the feedback element 4. The frequency-determining element 3 comprises a parallel combination of a coil and a capacitor and will henceforth be denoted as the parallel circuit. The cathode of tetrode 1 is connected to the impedance element 5 and the input of the inverting amplifier 6. The output of the inverting amplifier 6 is connected to the additional grid (the screen grid) of tetrode 1. The high voltage source 7 is connected to the anode of the tetrode through a choke coil 8.

Figure 2:
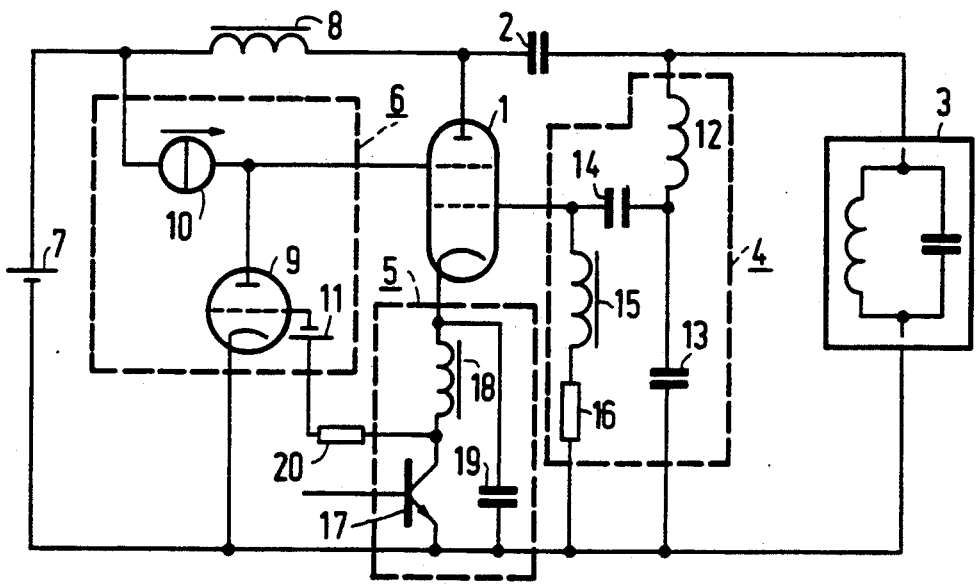
FIG. 2 shows a preferred embodiment of this oscillator.

FIG. 2 shows a preferred embodiment of the oscillator according to the invention. In this embodiment the inverting amplifier 6 is formed by a triode 9 in association with a D.C. current source 10 and a variable voltage source 11. The control grid of the triode 9 is connected, through the series combination of the variable voltage source 11 and the resistor 20, to the impedance element 5 formed here by a transistor 17. The collector of transistor 17 is connected to the cathode of the tetrode through the choke coil 18. The capacitor 19 is connected to the cathode of the tetrode 1. The anode of the triode 9 is connected to the current source 10 and to the screen grid of the tetrode 1. The other side of the current source is connected to the high voltage source 7. The feedback element 4 comprises a coil 12 connected on one side to parallel circuit 3 and on the other side to the capacitor 13 and a coupling capacitor 14. The other side of the coupling capacitor 14 is connected to the control grid of the tetrode 1. Choke coil 15 is connected on one side to the control grid of the tetrode 1 and on the other side to a resistor 16. The cathode of the triode 9, the negative side of the impedance element 5, resistor 16, capacitor 13 and the parallel circuit 3 are connected to the negative terminal of the high voltage source 7.

Hereinafter, the operation of the invention will be further explained with reference to the drawing Figures.

The tetrode 1 in association with the parallel circuit 3 and the feedback element 4 forms the core of the oscillator. Coupling capacitor 2 is present so that the high voltage source 7 will not be short-circuited through the choke coil 8 and the parallel circuit 3. Choke coil 8 prevents the flow of any high-frequency current through the high voltage source 7. The feedback element 4 provides a 180° phase shift which is necessary for realising oscillation and a certain reduction of the A.C. anode voltage of the tetrode. This resultant voltage is applied to the control grid of the tetrode.

Capacitor 14, choke coil 15 and resistor 16 form the circuit that provides automatic adjustment of the correct D.C. voltage on the control grid of the tetrode 1. During the maximum voltage levels of the A.C. voltage applied to the control grid, a current will flow in the control grid of the tetrode due to which the capacitor 14 will be charged. The D.C. voltage on the control grid of the tetrode will now be biased so that a condition of balance is achieved between the charge exerted on capacitor 14 by the grid current pulses and the charge flowing to the negative terminal of the high voltage source 7 through choke coil 15 and resistor 16. Choke coil 15 blocks the flow of A.C. current through resistor 16 to the negative terminal of the high voltage source 7.

As explained hereinbefore, the power supplied by the oscillator can be controlled by adjusting the value of the impedance element 5. In this preferred embodiment this adjustment is obtained by adjusting the base current of transistor 17. The capacitor 19 short-circuits the high-frequency cathode current to the negative terminal of the high voltage source 7. Choke coil 18 reduces the high-frequency voltage on the collector of the transistor 17, which voltage is caused by the remaining high-frequency voltage on the cathode of the tetrode 1.

The adjustable voltage source 11 provides the correct bias current adjustment of the triode 9, while the resistor 20 limits the grid current of the triode in the case of a positive grid voltage. Current source 10 produces the anode current of the triode 9 and the screen grid current of the tetrode 1. The voltage gain factor of the inverting amplifier 6 is determined by the properties of the triode, its bias current, the output impedance of the current source and the load impedance formed by the screen grid of the tetrode 1. As has been explained hereinbefore, connecting the voltage across the impedance element to the screen grid of the tetrode via the inverting amplifier leads to a reduction of the dissipation in the impedance element concerned. The extent of this reduction is determined by the properties of the tetrode and the voltage gain factor of the inverting amplifier. The larger the voltage amplification the larger the reduction of the dissipated power in transistor 17.

Figure 3:
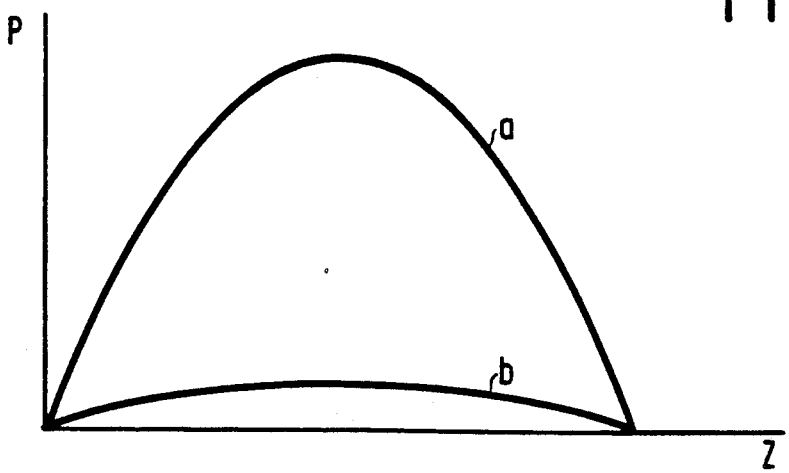
FIG. 3 shows graphs of the dissipated power in the impedance element plotted against the value of this impedance element, for a prior art triode oscillator as well as for the oscillator according to the invention.

In FIG. 3 the dissipated power in transistor 17 is plotted against the D.C. impedance value of the transistor 17. The dissipated power is plotted on a linear scale. Curve a represents the dissipated power in the transistor 17 in a prior art triode oscillator, whereas curve b represents this power of an oscillator according to the invention. From this graph it can be concluded that the use of the invention results in a considerable reduction of the dissipated power compared to the prior art triode oscillator.

We claim:

1. A high-frequency electron tube power oscillator comprising: an adjustable impedance element connected in series with the cathode of the electron tube, characterized in that the electron tube comprises a multigrid electron tube including at least one control grid and an additional grid, and an inverting amplifier having its input coupled to a side of the impedance element which is coupled to the cathode and whose output is coupled to the additional grid of the electron tube.

2. A high-frequency power oscillator as claimed in claim 1, wherein the inverting amplifier comprises a current source and a triode whose anode forms the output of the amplifier, to which output the current source is coupled, the control grid of the amplifier being connected to the negative terminal of a variable voltage source and the input of the amplifier being formed by the positive terminal of the variable voltage source.

3. A high frequency power oscillator comprising:
   a multi-grid electron tube having an anode, a cathode, a control grid and a screen grid,
   an adjustable impedance device,
   means for coupling said electron tube and said adjustable impedance device in series circuit to first and second terminals of a source of dc supply voltage, and with the adjustable impedance device connected to the cathode of the electron tube, a frequency-determining element coupled to the anode of the electron tube, a feedback circuit coupled to the anode and control grid of the electron tube, and an inverting amplifier having an input coupled to the cathode side of the adjustable impedance device and an output coupled to the screen grid of the electron tube.

4. A high frequency power oscillator as claimed in claim 3 wherein said inverting amplifier comprises:

a current source coupled to the first dc supply voltage terminal and to the screen grid of the electron tube via the output of the inverting amplifier, a triode electron tube having its anode coupled to said output of the inverting amplifier, and a variable voltage source coupled between a control grid of the triode tube and said input of the inverting amplifier.

5. A high frequency power oscillator as claimed in claim 4 wherein said adjustable impedance device comprises a transistor coupled between the cathode of the multi-grid tube and the second dc supply voltage terminal.

6. A high frequency power oscillator as claimed in claim 3 wherein said adjustable impedance device comprises a transistor coupled between the cathode of the multi-grid tube and the second dc supply voltage terminal.

7. A high frequency power oscillator as claimed in claim 6 wherein said adjustable impedance device further comprises an inductor coupling the transistor to the cathode of the multi-grid tube and a capacitor coupled in parallel with a series circuit of said inductor and said transistor.

8. A high frequency power oscillator as claimed in claim 6 wherein said feedback circuit comprises;

a series circuit of a first capacitor and an inductor capacitively coupled between the control grid and the anode of the multi-grid tube, and a second capacitor coupled between a junction of the first capacitor and the inductor and the second dc supply voltage terminal.

9. A high frequency power oscillator as claimed in claim 8 further comprising a high frequency choke connected between said first dc supply voltage terminal and the anode of the multi-grid electron tube.

10. A high frequency power oscillator as claimed in claim 8 wherein the feedback circuit further comprises;

a second inductor and a resistor connected in series between the control grid of the multi-grid tube and the second dc supply voltage terminal.

11. A high frequency power oscillator as claimed in claim 6 wherein said frequency-determining circuit comprises an LC resonant circuit capacitively coupled to the anode/cathode circuit of the multi-grid electron tube.

* * * * *